US008068045B2

(12) United States Patent
Ali et al.

(10) Patent No.: US 8,068,045 B2
(45) Date of Patent: Nov. 29, 2011

(54) CALIBRATION METHODS AND STRUCTURES FOR PIPELINED CONVERTER SYSTEMS

(75) Inventors: Ahmed Mohamed Abdelatty Ali, Oak Ridge, NC (US); Andrew Stacy Morgan, Stokesdale, NC (US)

(73) Assignee: Analog Devices, Inc., Norwood, MA (US)

( * ) Notice: Subject to any disclaimer, the term of this patent is extended or adjusted under 35 U.S.C. 154(b) by 38 days.

(21) Appl. No.: 12/715,102

(22) Filed: Mar. 1, 2010

(65) Prior Publication Data

US 2011/0210877 A1  Sep. 1, 2011

(51) Int. Cl.
  *H03M 1/20* (2006.01)
(52) U.S. Cl. ......... 341/131; 341/118; 341/120; 341/155
(58) Field of Classification Search .......... 341/118–121, 341/131, 155
See application file for complete search history.

(56) References Cited

U.S. PATENT DOCUMENTS

| | | | | |
|---|---|---|---|---|
| 4,751,496 | A | 6/1988 | Araki et al. | 340/347 |
| 6,404,364 | B1 * | 6/2002 | Fetterman et al. | 341/131 |
| 6,456,223 | B1 * | 9/2002 | Yu et al. | 341/161 |
| 6,462,685 | B1 * | 10/2002 | Korkala | 341/131 |
| 6,624,772 | B1 | 9/2003 | Gealow et al. | 341/120 |
| 6,734,818 | B2 | 5/2004 | Galton | 341/161 |
| 6,784,814 | B1 * | 8/2004 | Nair et al. | 341/118 |
| 6,894,631 | B1 | 5/2005 | Bardsley | 341/120 |
| 6,950,048 | B1 | 9/2005 | Slavin | 341/131 |
| 6,970,120 | B1 * | 11/2005 | Bjornsen | 341/120 |
| 7,006,028 | B2 | 2/2006 | Galton | 341/155 |

(Continued)

FOREIGN PATENT DOCUMENTS

| | | |
|---|---|---|
| EP | 1182781 A2 | 2/2002 |
| WO | 2010019202 A1 | 2/2010 |

OTHER PUBLICATIONS

Brannon, Brad, "Overcoming Converter Nonlinearities with Dither", AN-410 Application Note, Analog Devices, Inc., Oct. 2005, 8 pages.

(Continued)

*Primary Examiner* — Linh Nguyen
(74) *Attorney, Agent, or Firm* — Koppel, Patrick, Heybl & Philpott (57) ABSTRACT

Calibration methods and structures are provided for pipelined analog-to-digital converter systems. They are arranged to process samples of the digital codes with an algorithm that is preferably configured to repeatedly update an estimate of the transfer function with the difference between one of the input signals and the analog equivalent of the corresponding digital code. The calibration methods and structures are further configured to calibrate the transfer function of the converter stage wherein the samples are selected in accordance with various steps. These steps can include the step of injecting dither signals into a flash portion and an MDAC portion of the converter stage to thereby maintain dynamic range. They can also include the step of limiting the samples to those processed through a selected subrange of the subranges. They can further include the step of limiting the samples to those in which the absolute value of the input signals is less that 0.25 of the selected subrange and the absolute value of the dither signals is less that 0.25 of the selected subrange. If the selected subrange is not a central subrange, the steps can further include the step of shifting the samples by a distance between the selected subrange and the central subrange.

13 Claims, 6 Drawing Sheets

U.S. PATENT DOCUMENTS

| | | | |
|---|---|---|---|
| 7,015,851 B1 * | 3/2006 | Bruhns et al. | 341/155 |
| 7,187,310 B2 * | 3/2007 | El-Sankary et al. | 341/120 |
| 7,271,750 B1 | 9/2007 | Ali | 341/138 |
| 7,283,074 B2 | 10/2007 | Sheng et al. | 341/120 |
| 7,405,681 B2 * | 7/2008 | Jonsson et al. | 341/120 |
| 7,535,399 B2 * | 5/2009 | Abugharbieh et al. | 341/156 |
| 7,548,178 B2 | 6/2009 | Delano | 341/143 |
| 7,602,323 B2 * | 10/2009 | Galton et al. | 341/118 |
| 7,602,324 B1 * | 10/2009 | Huang et al. | 341/131 |
| 7,786,910 B2 * | 8/2010 | Ali et al. | 341/131 |
| 7,898,452 B2 * | 3/2011 | Lewis et al. | 341/161 |

OTHER PUBLICATIONS

Kester, Walt, "The Good, the Bad, and the Ugly Aspects of ADC Input Noise—Is No Noise Good Noise?", Tutorial MT-004, Analog Devices, Inc., Oct. 2005, pp. 1-5.

PCT Notification of the International Search Report and the Written Opinion of the International Searching Authority, Dated Jun. 29, 2011; For International Application No. PCT/US2011/000247.

U.S. Patent Publication No. 2009/0102688 A1. Cesura et al., Apr. 23, 2009.

* cited by examiner

CALIBRATION METHODS AND STRUCTURES FOR PIPELINED CONVERTER SYSTEMS

BACKGROUND OF THE INVENTION

1. Field of the Invention

The present disclosure relates generally to pipelined converter systems.

2. Description of the Related Art

Pipelined analog-to-digital signal converter systems are often used in high-speed, high-resolution conversion applications. These systems generally realize a desired number of conversion bits with a cascade (i.e., a pipeline) of lower-resolution converter stages and thus achieve high resolution at sampling speeds that are difficult to realize with other converter systems. Each stage of a pipelined system quantizes that stage's input signal to a predetermined number of digital bits and forms an analog residue signal which is presented to a succeeding stage for further signal processing.

Errors are induced into the transfer functions of the residue signals of the converter stages by various effects. When the converter stages are realized with switched capacitors and amplifiers, for example, mismatches in the capacitors and low gain in the amplifiers can both degrade the accuracy of the transfer functions. In addition, low gain in amplifiers Although calibration methods have been proposed to reduce transfer function errors, they have generally suffered from various defects. A major one of these is the loss of dynamic range in the transfer function of the converter stage that is being calibrated.

BRIEF SUMMARY OF THE INVENTION

The present disclosure is generally directed to calibration methods and structures for pipelined converter systems. The drawings and the following description provide an enabling disclosure and the appended claims particularly point out and distinctly claim disclosed subject matter and equivalents thereof.

DETAILED DESCRIPTION OF THE INVENTION

Calibration methods and structures are addressed in FIGS. 1-7 for pipelined analog-to-digital converter systems. These systems generally include a plurality of successively-arranged converter stages that are configured to process input signals through transfer function subranges of the stages to thereby provide corresponding digital codes. At least a selected converter stage is configured to provide residue signals to a succeeding converter stage.

The calibration methods and structures are arranged to process samples of the digital codes with an algorithm that is preferably configured to repeatedly update an estimate of the transfer function with the difference between one of the input signals and the analog equivalent of the corresponding digital code. The calibration methods and structures are further configured to calibrate the transfer function of the converter stage wherein the samples are selected in accordance with various steps.

These steps can include the step of injecting dither signals into a flash analog-to-digital converter portion and a multiplying analog-to-digital converter (MDAC) portion of the converter stage to thereby maintain dynamic range.

They can also include the step of limiting the samples to those processed through a selected subrange of the subranges. They can further include the step of limiting the samples to those in which the absolute value of the input signals is less that 0.25 of the selected subrange and the absolute value of the dither signals is less that 0.25 of the selected subrange. If the selected subrange is not a central subrange, the steps can further include the step of shifting the samples by a distance between the selected subrange and the central subrange.

Figure 1:
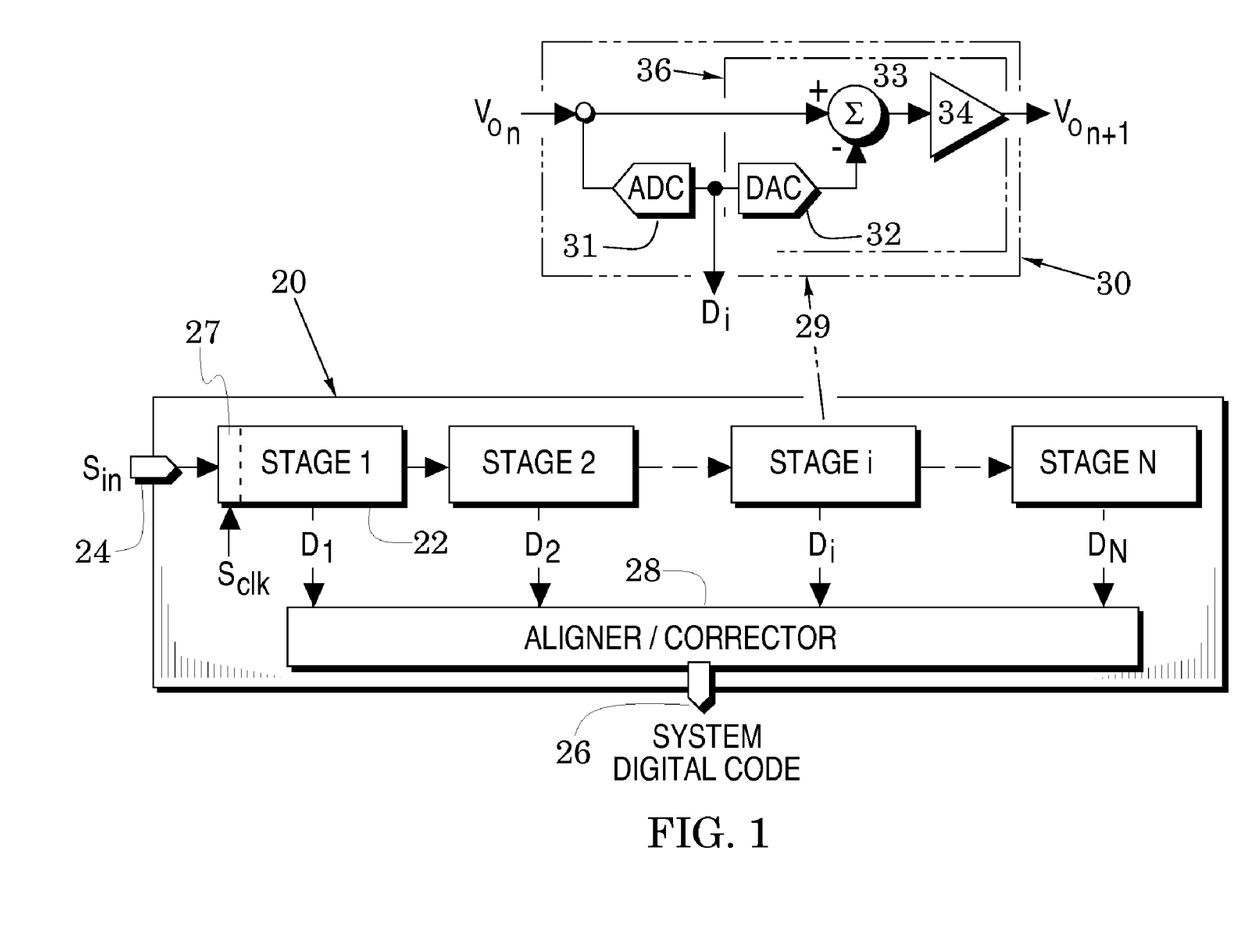
FIG. 1 is a diagram of a pipelined converter system embodiment of the present disclosure.

In particular, system embodiments of the present disclosure are directed to pipelined analog-to-digital converter systems such as the converter system 20 of FIG. 1 which is formed with successively-arranged signal-processing stages 22 that process an analog input signal $S_{in}$ at an input port 24 into a corresponding digital code at an output port 26. The initial one of the stages may include a sampler portion 27 (the sampler may be arranged as a separate element in other embodiments) that provides successive samples of the input signal at a rate given by a system clock signal $S_{clk}$. In an embodiment, the sampler may be configured as a sample-and-hold amplifier (SHA).

In response to each sample from the sampler 27, converter stage 1 generates a predetermined number of most-significant digital bits $D_1$ and also forms a residue signal which is passed to stage 2 for further processing. The residue signal is the amplified and shifted difference between the analog sample and an analog value that is represented by the digital bits $D_1$. Converter stage 1 is configured to shift the residue signal up or down as needed to locate it in an analog window similar to the window that included the original sample. This stage is further configured to amplify the difference that the total range of residue signals is similar to the range of input samples from the sampler 27.

In a similar manner, stage 2 processes the residue signal from stage 1 to provide the next-most-significant digital bits $D_2$ and a residue signal that is passed to the succeeding stage for further processing. This process continues through subsequent stages (e.g., stage i and stage N of FIG. 1) until the least-significant bits $D_N$ are generated.

Although the digital bits $D_1, D_2$ - - - $D_N$ are generated on successive clock signals, they all correspond to the original sample provided by the sampler 27. The converter stages 24 are generally configured to provide redundant code bits and the additional conversion information in these redundant code bits is used to correct conversion errors which may occur when the analog input signal or the residue signals are near transition points between analog regions that correspond to adjacent digital codes. This correction of conversion errors and the temporal alignment of bits is performed by an aligner/ corrector 28 to thereby provide the digital code at the output port 26 that corresponds to the original analog sample from the sampler 27.

Example arrow 29 points to an exemplary embodiment 30 of the signal converters 22. In this embodiment, an analog-to-digital converter (ADC) 31 converts the respective analog output signal $V_{on}$ of a preceding one of the converter stages (or the sampler 27) to corresponding digital bits $D_i$. A digital-to-analog converter (DAC) 32 converts these digital bits to a corresponding analog signal which is differenced with the analog output signal $V_{on}$ (of a preceding stage) in a summer 33 to provide a difference signal. The difference signal is then amplified and level shifted in an amplifier 34 to provide a residue $V_{on+1}$ for processing by the succeeding converter stage. As previously noted, the residue signal is presented in an analog window that substantially matches the analog window presented to the current stage.

A broken-line box 36 encloses the elements 32, 33 and 34 to indicate that they are directed to generation of the residue signal $V_{on+1}$. Accordingly, this portion of the converter stage is generally referred to as a multiplying digital-to-analog converter (MDAC).

Figure 2:
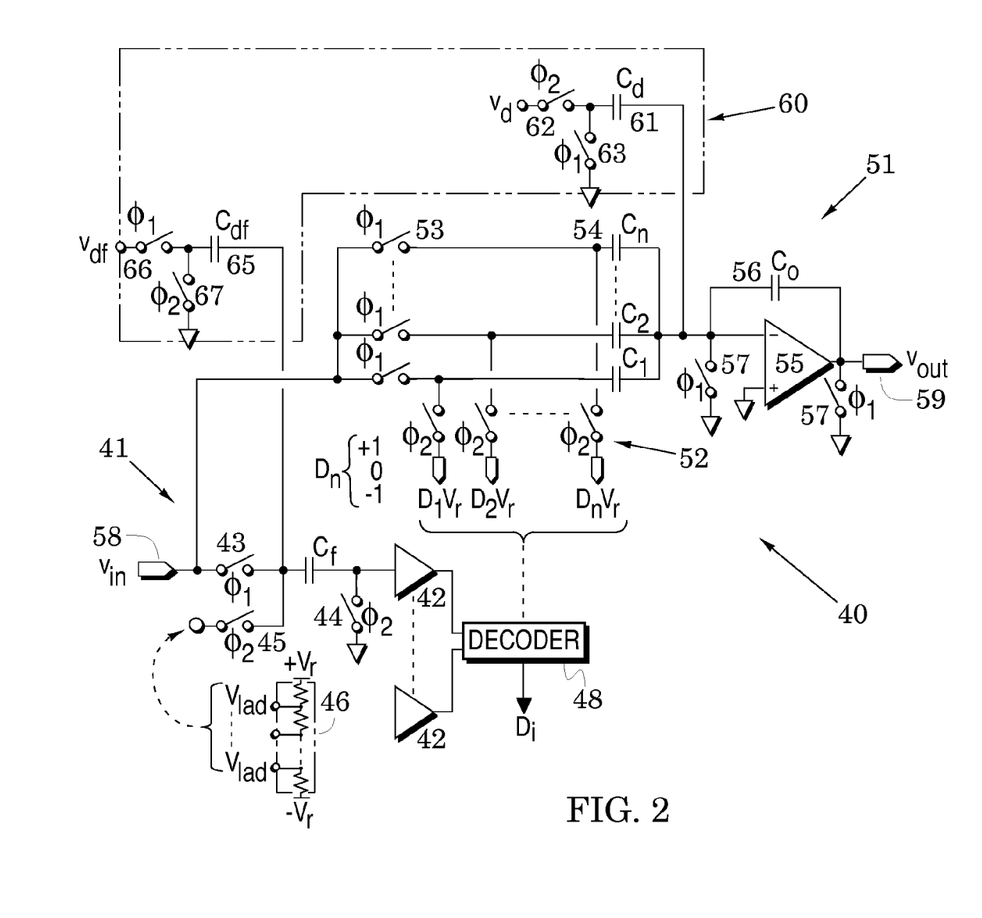
FIG. 2 is a diagram that includes a switched-capacitor embodiment of a multiplying digital-to-analog converter in stages of the system of FIG. 1.

FIG. 2 illustrates a switched-capacitor embodiment 40 of the signal converters 22 of FIG. 1. The flash ADC portion 41 of the converter stage 40 is configured as a flash converter and, accordingly, it includes a bank of comparators 42. As shown by an exemplary one of these comparators, they are each preceded by flash capacitor $C_f$ and a switch 43 that closes in a first phase φ1 of each cycle of the clock signal $S_{clk}$ that was introduced in FIG. 1. A second switch 44 is in shunt with the input of its comparator 42 and it closes in the second phase $\phi_2$ of each clock cycle. A third switch 45 is coupled to a circuit node between the input of the capacitor $C_s$ and the second switch 44. This third switch is supplied with a respective one of ladder voltages $v_{lad}$ that are generated, for example, by a ladder 46 of resistors that are serially-coupled between reference voltages $+v_r$ and $-v_r$.

A decoder 48 is configured to receive the outputs of the comparators 41 to thereby provide the digital bits $D_i$ of this converter stage and also provide appropriate ones of multipliers $D_n$ (that can be any one of +1, 0, and −1). It is noted that the switches 42, 43 and 44 and flash capacitor $C_f$ are provided to each of the comparators 41, but that only one set is shown in FIG. 2 for clarity of illustration.

In the MADC portion 51 of the converter stage 40, the multipliers $D_n$ are received by a bank 52 of switches that close in phase $\phi_2$ of each clock cycle. Appropriate products of the multipliers $D_n$ and the reference voltage $v_r$ are thus available to the bank 52 of switches. Each of these switches is coupled to a circuit node between a corresponding input switch 53 and a corresponding one of input capacitors 54 that, in turn, is coupled to the negative input of a differential amplifier 55. An output capacitor 56 is coupled across this amplifier and switches 57 are coupled to the input and output of this amplifier to close in phase $\phi_1$ of each clock cycle. Input signals are received at the stage's input port 58 which is coupled to the switches 43 and 53. Output residue signals are provided at an output port 59 of the MDAC portion 51.

The operation of the converter stage 40 can be described with reference to a selected one of the clock cycles. In the second phase $\phi_2$ of the preceding clock cycle (the cycle prior to the selected cycle), switches 44 and 45 close to store a respective one of the ladder voltages $v_{lad}$ into the flash capacitor $C_f$.

In the first phase $\phi_1$ of the selected clock cycle, switch 43 closes so that the input voltage $v_{in}$ from the sampler (27 in FIG. 1) is compared to the stored ladder voltage $v_{lad}$ and the comparison decision is provided by the respective comparator 42 and provided to the decoder 48. In a similar manner, the other comparators provide respective decisions to the decoder 48. In response, the decoder 48 determines the location of the input voltage $v_{in}$ to thereby provide the digital bits $D_i$ and to also provide the corresponding multipliers $D_n$, so that they are available to the bank 52 of switches prior to the second phase $\phi_2$ of the selected clock cycle.

In the first phase $\phi_1$ of the selected clock cycle, the switches 53 close so that the input voltage $v_{in}$ from the sampler (27 in FIG. 1) is stored in the input capacitors C. The switches 57 also close during this phase so that the voltage across the output capacitor $C_o$ is cleared. During the second phase $\phi_2$ of the selected clock cycle, the bank 52 of switches close so that each of the products $D_n v_{ref}$ is applied to a respective one of the input capacitors $C_n$. The stored charges in the input capacitors $C_n$ are thus selectively injected into the output capacitor $C_o$ to generate the appropriate output voltage $v_{out}$. This output voltage $v_{out}$ is the residue signal that is passed to the succeeding converter stage for processing in the succeeding clock cycle.

In the following description it is assumed the converter stage 40 of FIG. 2 forms stage 1 of the converter system 20 of FIG. 1 (less the sampler portion 27). If it is also assumed that the input voltage to the converter stage 40 is close to the center of the input range of the converter system (20 in FIG. 1), the decoder 48 of FIG. 2 will cause the multipliers $D_n$, to all be zero so that the transfer function of the converter stage 40 is the central segment 71 in the graph 70 of FIG. 3. Broken lines 72 extend the segment 71 and represent the system's analog (i.e., residue) transfer function throughout all of the converter stages of FIG. 1. The slope of the lines 72 indicate residue gain through the converter stage 40.

When the input voltage $v_{in}$ at the input port 58 is further from the center of the input range, the decoder 48 will vary the multipliers $D_n$, of FIG. 2 so that other transfer function segments are sufficiently shifted up or down from the system transfer function 72 to keep the output voltages in the predetermined portion of the output voltage range. For example, the arrow 74 indicates how a portion of the input voltage range is shifted upward to form segment 75 of the transfer function of the converter stage 40.

The slope of the transfer function 72 is determined by the ratio of the capacitance of the output capacitor $C_o$ of FIG. 2 to the sum of the capacitances of the input capacitors C. The shifts up and down are determined by the multipliers $D_n$, of the decoder 48 of FIG. 2. The ratios and shifts are arranged so that the output of the converter stage 40 is one half that of the full scale output voltage range $V_{fs}$ to thereby provide room for an error correction range as shown in the graph 70 of FIG. 3. This error correction range facilitates error corrections that are performed by the aligner/corrector 28 of FIG. 1 to enhance the conversion accuracy of the converter system 20.

Real-life switched-capacitor converter stages are generally prone to the generation of various conversion errors. If the capacitances of the input capacitors $C_n$, and/or the output capacitor $C_o$ vary from their predetermined values, for example, the slopes of the transfer function in each subrange of FIG. 3 will vary from their predetermined slope. The predetermined slope can also be altered if the gain of the differential amplifier 54 of FIG. 2 is not sufficient to cause its differential input voltage to be substantially zero.

Figure 3:
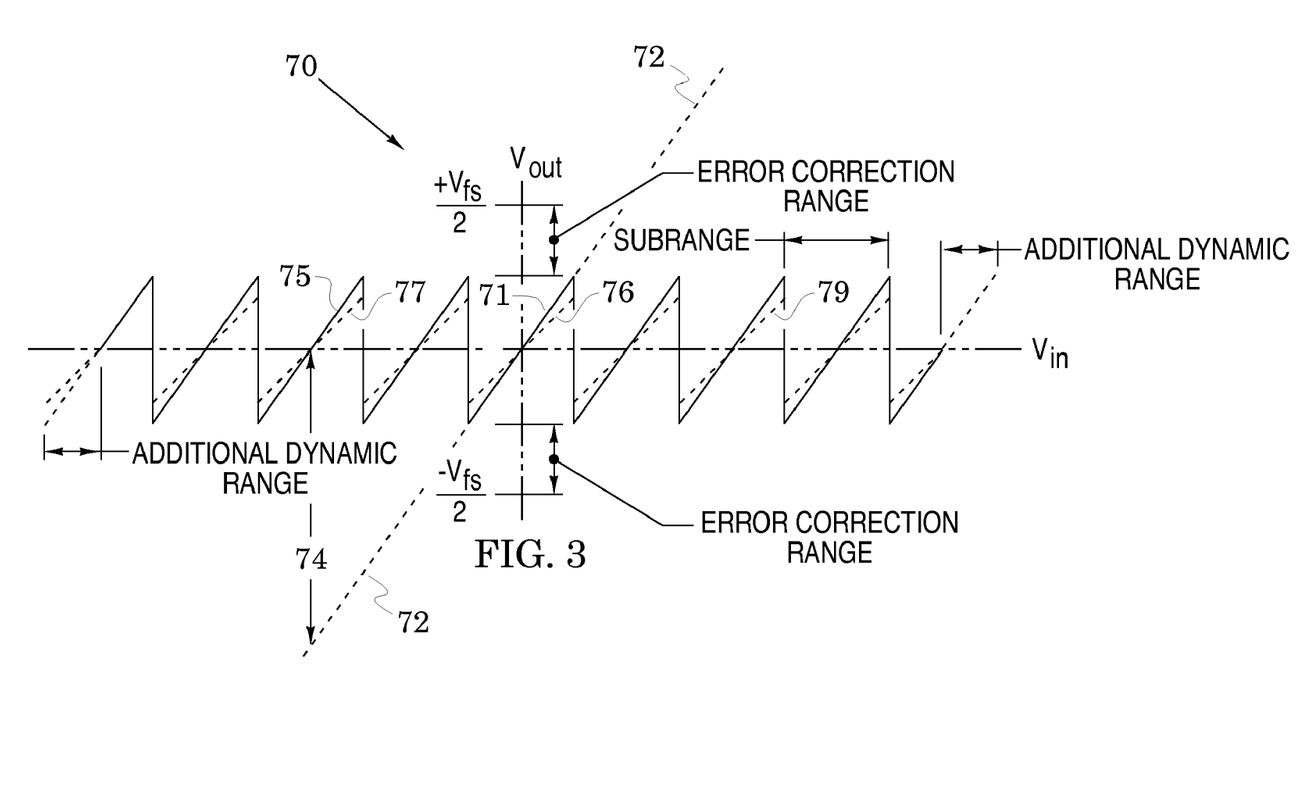
FIG. 3 is a graph that indicates a residue signal of the multiplying digital-to-analog converter of FIG. 2 as it relates to the transfer function of the converter system of FIG. 1.

These conversion degradations are initially illustrated in FIG. 3 by exemplary rotation of the ideal segments (e.g., segments 71 and 75) to broken-line segments that indicate gain errors (e.g., segments 76, 77 and 79). These latter segments illustrate a degradation in which the signal stage gain through the converter stage 40 of FIG. 2 is less than it should be. If the stage gain were greater than it should be, these broken-line segments would be oppositely rotated from the segments 70.

Figure 4:
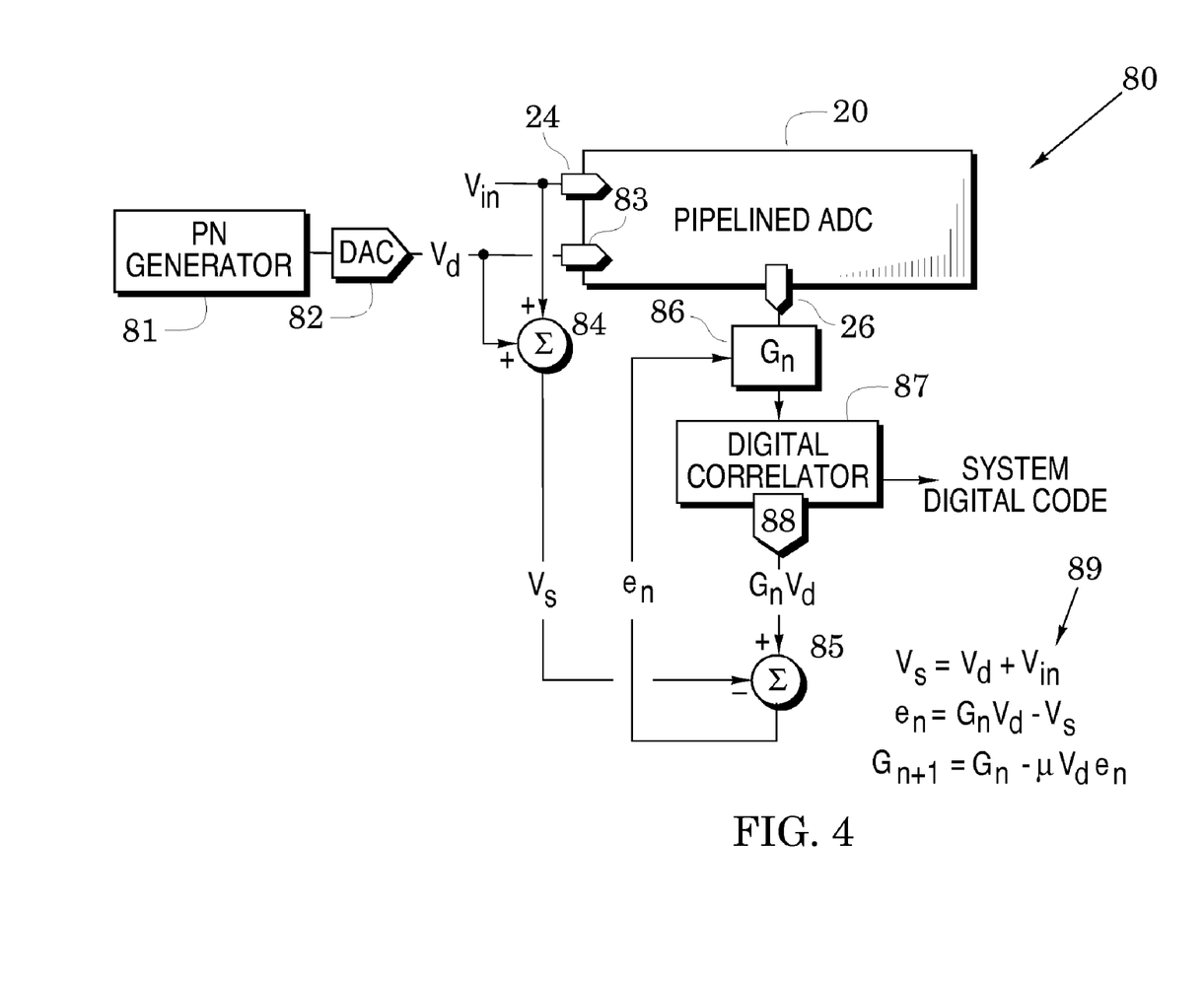
FIG. 4 is a diagram of a calibration structure embodiment for use with the system of FIG. 1.

These conversion errors can be reduced by calibrating the stage gain through the MDAC portion of the converter stage 40 of FIG. 2. This may be accomplished with structures such as the calibration structure embodiment 80 of FIG. 4 in which a pseudo-random (PN) generator 81 provides a PN digital code to a DAC 82 which inserts the corresponding analog dither signal $V_d$ into the converter stage 40 (of FIG. 3) via a system port 83. The dither signal is also provided to a summer 84 which, in addition, receives the input signal $V_{in}$. In response, the summer 84 delivers the summed input signal $V_s$ to a differencer 85. Equations 89 in FIG. 4 show that the summed input signal is given by $V_s=V_d+V_{in}$.

The system digital code at the ADC output port 26 is increased or decreased in a digital multiplier 86 which provides digital coefficients to a digital correlator 87 with an initial estimate $G_n$ of the signal gain through the converter stage 40. Correlators are typically configured to digitally separate uncorrelated signals. In this embodiment, the correlator 87 separates the system digital code (the digitized version of the input signal $V_{in}$) from a digitized version of the input dither signal $V_d$. Via a DAC 88, the latter signal is then provided to the summer 85 as the analog signal $G_nV_d$. Equations 89 in FIG. 4 indicate that the output of the summer 85 is an error signal $e_n=G_nV_d-V_s$.

Essentially, this error signal indicates the error between the assumed gain and the actual gain of the converter stage 40. When this error signal is fed back to the digital multiplier 86, it updates the digital stage gain in accordance with the algorithm:

$$G_{n+1}=G_n-\mu v_d e_n \qquad (1)$$

in which μ is an algorithm step size selected to obtain a compromise between the speed of the convergence to a final stage gain and the accuracy of that final stage gain. The final gain value obtained by the algorithm (1) effectively calibrates the system to thereby correct processing errors in the converter stage 40. The algorithm (1) is generally referred to as a least-mean-square algorithm and is an exemplary one of various algorithms that can be used for obtaining the calibrated gain value for the selected converter stage by repeatedly updating an estimate of a transfer function value with the difference between input signals and the analog equivalent of the corresponding digital codes.

Figure 5:
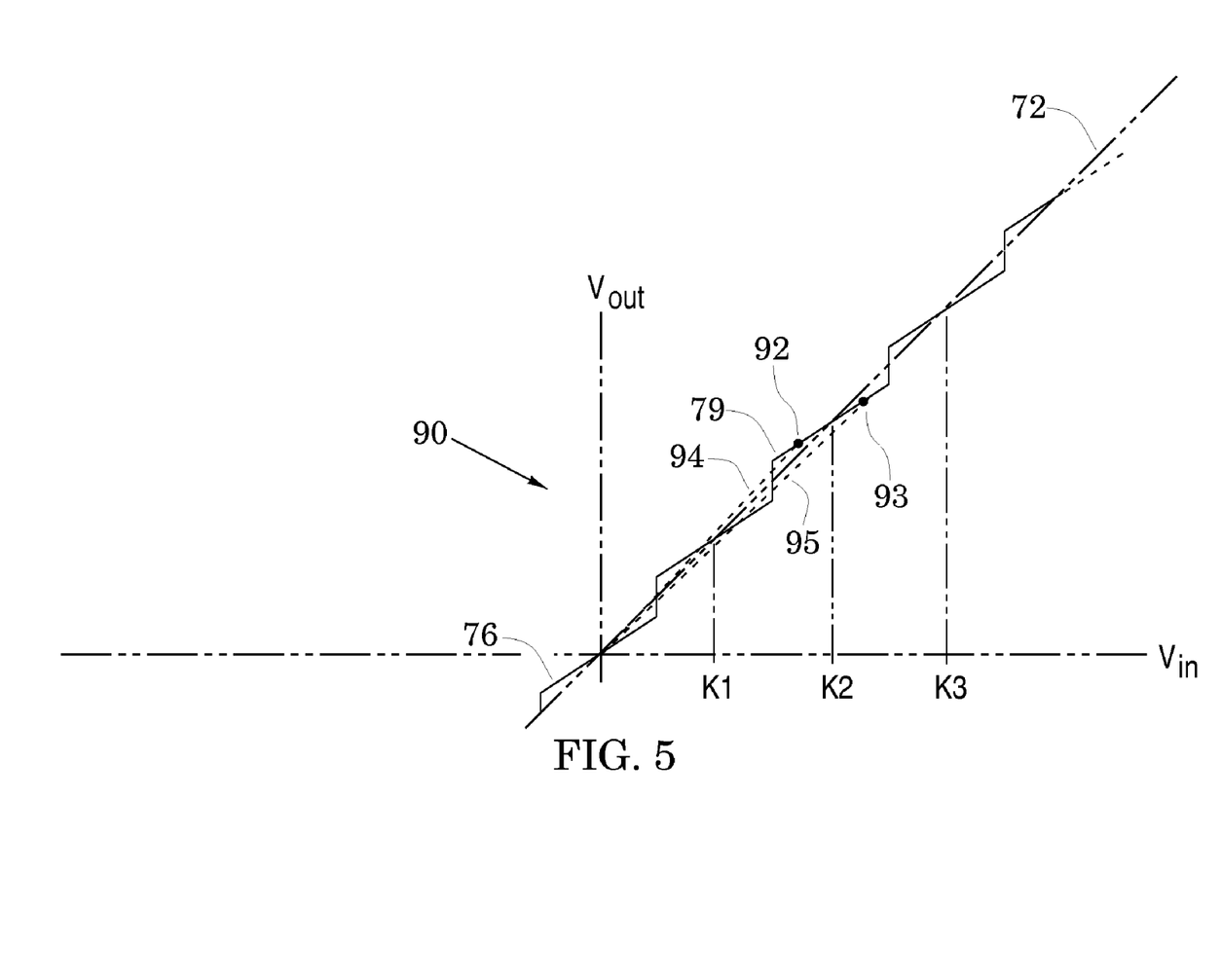
FIG. 5 is a graph of a portion of the transfer function of the converter system of FIG. 1.

The graph 90 of FIG. 5 includes the system transfer function 72 of FIG. 3 but in FIG. 5 the segments, e.g., segments 76 and 79, are not shifted up or down by MDAC action. Dots 92 and 93 in the segment 79 indicate exemplary operating points in that subrange and broken lines 94 and 95 are drawn from the graph origin to these operating points. In an important observation, it is noted that the segment 79 illustrates the gain error through the converter stage of FIG. 2 whereas the broken lines 94 and 95 indicate gain error of the entire converter system (20 in FIG. 1).

In order to provide calibration of the converter stage 40 of FIG. 2, it is therefore observed that attention must be directed at the stage gain error in the segment 78 and not at the system stage gain error represented by the lines 84 and 85. With this important recognition, an exemplary algorithm of this disclosure (e.g., the algorithm (1) above) is configured to be limited to operate in only one of the transfer function subranges of FIG. 3 at a given time.

For example, the algorithm may be only applied to data points of the converter system (20 in FIG. 1) that come from the segment 71 which is the middle one of the converter stage's subranges. In this subrange, the converter stage gain error is the same as the converter system stage gain error but, in other transfer function subranges, these stage gain errors differ. Since it is desired to calibrate stage errors, the algorithm is preferably limited to operate as noted above.

In another important observation, it is noted that if a dither signal is injected into the MDAC 51 of the converter stage 40 of FIG. 2 but not into the flash converter 41, this action may cause the resultant residue signal to move into the error correction range of FIG. 3. Accordingly, an exemplary algorithm of this disclosure is preferably enabled by the injection of dither signals into both of the flash 41 and MDAC 51 portions of the converter stage 40 of FIG. 2.

Yet another observation recognizes that two signals are uncorrelated if changes in one of them are unrelated to changes in the other. The injected dither signal is preferably uncorrelated with the input signal that is being processed by the system 20 of FIG. 1 so that the output random signal can be separated from the output code that corresponds to the system's input signal. For example, the signals can be separated in the digital correlator 87 of FIG. 4. As exemplified in FIG. 4, gain error may then be calculated by comparison of the input and output random signal amplitudes and this gain error used to correct the processing of the system.

Accordingly, an exemplary algorithm of this disclosure is enabled by independently limiting the system's input signal and the injected random signal. In a system embodiment, the absolute value of the input signal is limited to occupy less than 25% of a subrange of FIG. 3 and the absolute value of the injected random signal is independently limited to occupy less than 25% of the same subrange. Only these signals will be candidates for algorithmic processing.

Figure 6:
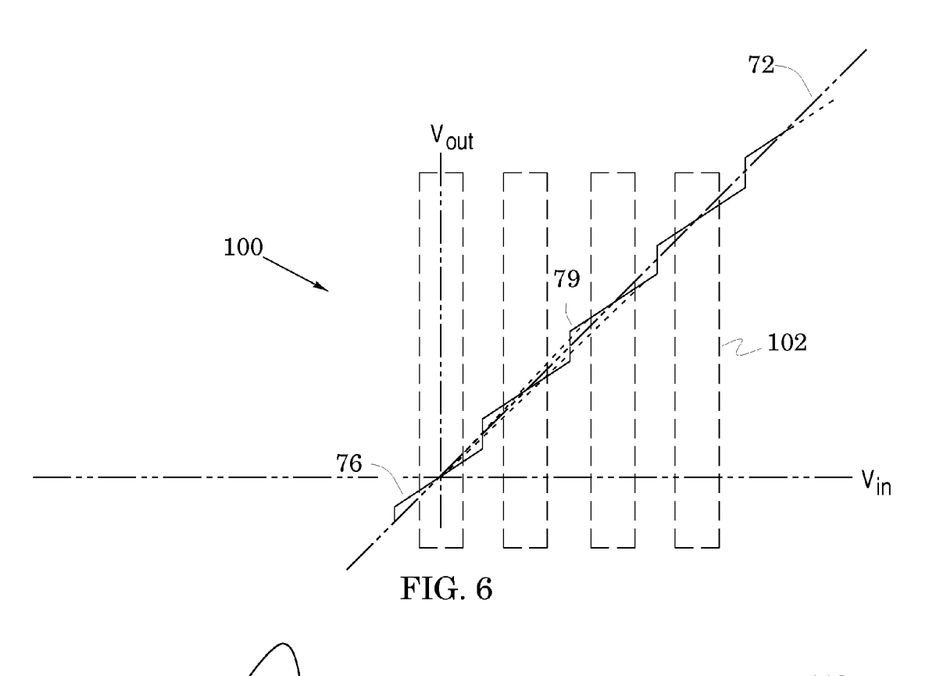
FIG. 6 is a graph similar to the graph of FIG. 5 but configured to indicate preferred calibration processing regions.
Figure 7:
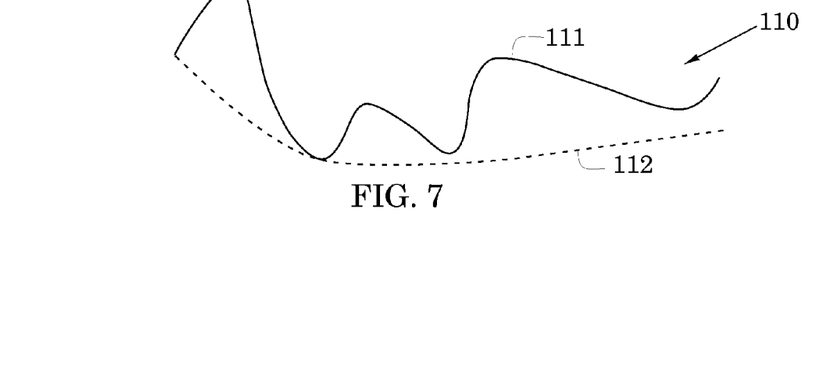
FIG. 7 is an exemplary plot of the transfer function of an exemplary detector for use in calibration methods for the system of FIG. 1.

This concept is illustrated in the graph 100 of FIG. 6 which includes elements of the graph 90 of FIG. 5 with like elements indicated by like reference numbers. Broken-line rectangles 102 have been centered on each of the subrange segments, e.g., segments 76 and 79. The rectangles have a width of one-half of their respective subrange. In accordance with the description above, only input signals that lie within these segments (but are not at the limit of these segments) will be accepted for processing by algorithms of the disclosure. In addition, only dither signals that lie within these segments (but are not at the limit of these segments) will be accepted for processing by algorithms of the disclosure. This restraint illustrated by FIG. 6 may be expressed by saying that the absolute value of the input signals must be less than 0.25 of a subrange and that the absolute value of the dither signals must also be less than 0.25 of a subrange.

Attention is now returned to the converter stage 40 of FIG. 3 and, in particular, to injection structures 60 which have been added to facilitate injection of the pseudo-random dither signals in accordance with the observations made above. These structures include a dither capacitor $C_d$ 61 that receives a dither signal $v_d$ through a switched capacitor 62 wherein the path between these elements is coupled to ground via a switched capacitor 63. The output of the dither capacitor 61 is coupled to the negative input of the differential amplifier 55.

The injection structures 60 also include a flash dither capacitor $C_{df}$ 65 that receives a flash dither signal $v_{df}$ through a switched capacitor 66 wherein the path between these elements is coupled to ground via a switched capacitor 67. The output of the flash dither capacitor 65 is coupled to drive the flash capacitor $C_f$.

In general, the dither signal $v_d$ and the flash dither signal $v_{df}$ are the same signal and the amplitude of this signal is set to observe the restraint above in which the absolute value of these signals is less than 0.25 of a subrange. In order to also insure that a calibration algorithm uses is applied only to input signals whose absolute value is also less than 0.25 of a subrange, a pair of appropriate comparators can be added to the comparators 42 in FIG. 2. This pair of comparators can indicate which input signals qualify for use with the calibration algorithm.

The algorithmic processing in FIG. 4 can be extended to handle other transfer function subranges if samples from those subranges are appropriately shifted. For example, samples in the subrange 79 of FIG. 5 can be shifted by K2 which brings this subrange in to coincide with the central subrange 76. Samples from other subranges can also be appropriately shifted (e.g., by shifting by K1 or K3) to coincide with the central subrange 76. Samples can be stored in respective bins and handled as described above.

Various system effects may cause the subrange shifts (e.g., K1, K2 and K3) to be poorly defined and/or variable. For example, the converter system 20 of FIG. 1 was shown to have a sampler (or SHA) for obtaining input samples. Other converter systems may be configured to operate without a sampler or SHA and it is recognized that this may induce bandwidth mismatches between the flash and MDAC sections of a converter stage. It is further recognized that there may be offsets in the flash portion of converter stages. Errors in the subrange shifts due to these error sources can be reduced by dynamically measuring the size of each subrange. In particular, the minimum voltage that switches the flash to the next subrange is detected.

This may be accomplished via the use of a digital leaky trough detector which is a detector similar to a peak detector but is one that operates on minima rather than maxima. The detector is preferably slow enough to ignore instantaneous signal changes yet fast enough to track slower changes. The action of a leaky trough detector is exemplified in the graph 110 of FIG. 7 by the detector curve 112 that decreases rapidly but increases slowly to thereby track dither signals exemplified by the curve 111. A standard peak detector can be used to sense the upper or maxima boundaries of subranges. These detectors are used only for the dither signals in FIG. 2. Thresholds of input signals can be monitored with the additional pair of comparators that was discussed above.

It is also noted that the calibration methods discussed above facilitate the use of low-level input signals that cause the converter system (20 in FIG. 1) to operate on a small region of its transfer function so that small errors of the transfer function may substantially reduce converter performance. If the input signal is randomly dithered across a limited region, these distortions can be significantly reduced because the processing then takes place over randomly selected portions of the transfer function. By generating the inserted dither signals with a digital-to-analog converter, the digital signal can be subtracted from the system's output code.

The result is that the system's input signal is randomly processed down different portions of the system's transfer function. Preferably, a large number of dither levels is employed. In addition, an odd number of dither levels is preferably used because when these levels occupy less than a subrange, it has been found that the processing will also take place over randomly selected portions of the transfer function of each of the converter system's stages.

The converter system structures and processes discussed above insure that calibration of a converter stage is substantially enhanced by observing the following rules while calibrating the stage with, for example, a least-mean-squares algorithm directed to injected PN signals:

inject dither signals into both of a selected converter stage's flash and MDAC portions to thereby maintain the stage's dynamic range and not intrude into the error correction range of the stage's MDAC transfer function;

limit processed samples to those through one subrange of the selected converter stag to thereby insure they address conversion errors of this stage rather than conversion errors in the converter system;

if selected subrange is not the converter stage's central subrange, shifting samples by the distance between these subranges; and to insure input and dither signals are uncorrelated (as required by the algorithm), limit the absolute value of the input signal to be less that 0.25 of the selected subrange and independently limit the absolute value of the dither signal to also be less that 0.25 of the selected subrange.

The processes above have been introduced to detect and calibrate gain errors in the MDAC sections of converter stages. By breaking the broken-line rectangles 102 of FIG. 6 into smaller units, the methods introduced above can be used to also measure and calibrate nonlinearity errors. Essentially, the introduced methods are applied to smaller slices of the input signals. In order to not introduce correlation between dither and input signals, however, this processing must be done independently for these signals.

It is noted that gain and linearity errors can also be reduced by forming the capacitors in the dither and MDAC portions of the converter stage 40 of FIG. 2 with a plurality of unit capacitors, i.e., capacitors having one selected capacitance value. These errors can also be reduced by shuffling the unit capacitors during stage operation. That is, by alternating which unit capacitors are used at any given time.

An enabling disclosure has been provided of signal converter system embodiments which substantially reduce symmetrical and asymmetrical INL errors. The embodiments of the disclosure described herein are exemplary and numerous modifications, variations and rearrangements can be readily envisioned to achieve substantially equivalent results, all of which are intended to be embraced within the spirit and scope of the appended claims.

We claim:

1. A method to calibrate a converter stage of a pipelined converter system that processes input signals through transfer function subranges of said converter stage to thereby provide corresponding digital codes, the method comprising the step of;

processing samples of said digital codes with an algorithm configured to calibrate the transfer function of said converter stage wherein said samples are selected in accordance with the steps of:

injecting dither signals into a flash analog-to-digital converter portion and a multiplying analog-to-digital converter (MDAC) portion of said converter stage;

limiting said samples to those processed through a selected subrange of said subranges; and further limiting said samples to those in which the absolute value of said input signals is less that 0.25 of said selected subrange and the absolute value of said dither signals is less that 0.25 of said selected subrange.

2. The method of claim 1, wherein said algorithm is a least-mean-squares algorithm.

3. The method of claim 1, wherein said algorithm is configured to repeatedly update an estimate of said transfer function with the difference between one of said input signals and the analog equivalent of the corresponding digital code.

4. The method of claim 1, further including the steps of:
  determining that said selected subrange is not a central subrange; and
  shifting said samples by a distance between said selected subrange and said central subrange.

5. The method of claim 1, further including the step of realizing said flash portion and said MDAC portion with switched capacitors.

6. A method to calibrate a converter stage of a switched-capacitor pipelined converter system that processes input signals through transfer function subranges of said converter stage to thereby provide corresponding digital codes, the method comprising the step of;
  processing samples of said digital codes with a least-mean-squares algorithm to calibrate the transfer function of said converter stage wherein said samples are selected in accordance with the steps of:
    injecting dither signals into a flash analog-to-digital converter portion and a multiplying analog-to-digital converter (MDAC) portion of said converter stage;
    limiting said samples to those processed through a selected subrange of said subranges; and
    further limiting said samples to those in which the absolute value of said input signals is less that 0.25 of said selected subrange and the absolute value of said dither signals is less that 0.25 of said selected subrange.

7. The method of claim 6, wherein said algorithm is configured to repeatedly update an estimate of said transfer function with the difference between one of said input signals and the analog equivalent of the corresponding digital code.

8. The method of claim 6, further including the steps of:
  determining that said selected subrange is not a central subrange; and
  shifting said samples by a distance between said selected subrange and said central subrange.

9. A pipelined converter system, comprising:
  a plurality of successively-arranged converter stages configured to process input signals through transfer function subranges of said stages to thereby provide corresponding digital codes wherein at least a selected converter stage is configured to provide residue signals to a succeeding converter stage; and
  a calibration structure arranged to process samples of said digital codes with an algorithm configured to calibrate the transfer function of said converter stage wherein said samples are selected in accordance with the steps of:
    injecting dither signals into a flash analog-to-digital converter portion and a multiplying analog-to-digital converter (MDAC) portion of said converter stage;
    limiting said samples to those processed through a selected subrange of said subranges; and
    further limiting said samples to those in which the absolute value of said input signals is less that 0.25 of said selected subrange and the absolute value of said dither signals is less that 0.25 of said selected subrange.

10. The system of claim 9, wherein said algorithm is configured to repeatedly update an estimate of said transfer function with the difference between one of said input signals and the analog equivalent of the corresponding digital code.

11. The system of claim 9, further including the steps of:
  determining that said selected subrange is not a central subrange; and
  shifting said samples by a distance between said selected subrange and said central subrange.

12. The system of claim 9, further including the step of realizing said flash portion and said MDAC portion with switched capacitors.

13. The system of claim 9, wherein said converter stages are switched-capacitor converter stages.

* * * * *